(12) United States Patent
Kohno et al.

(10) Patent No.: US 6,465,264 B1
(45) Date of Patent: Oct. 15, 2002

(54) METHOD FOR PRODUCING SEMICONDUCTOR DEVICE AND APPARATUS USABLE THEREIN

(75) Inventors: Ryuji Kohno, Chiyoda; Hiroya Shimizu, Ryuugasaki; Masatoshi Kanamaru, Miho; Atsushi Hosogane, Iwama; Toshio Miyatake, Chiyoda; Hideo Miura, Koshigaya; Tatsuya Nagata, Ishioka; Yoshishige Endo, Tsuchiura; Masaaki Namba, Sayama; Yuji Wada, Tachikawa, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/654,612

(22) Filed: Sep. 1, 2000

(30) Foreign Application Priority Data

Sep. 27, 1999 (JP) .......................... 11-271803

(51) Int. Cl.[7] .............................. G01R 31/26
(52) U.S. Cl. ..................................... 438/15
(58) Field of Search .................. 356/237.5; 714/42; 340/815.52; 358/118; 438/14, 15

(56) References Cited

U.S. PATENT DOCUMENTS 5,568,563 A    10/1996   Tanaka et al.
5,956,134 A  * 9/1999   Roy .......................... 356/237.5
6,134,677 A  * 10/2000  Lindsay ....................... 714/42

FOREIGN PATENT DOCUMENTS

| JP | 3131048 | 6/1991 |
|----|---------|--------|
| JP | 6-23216 | 8/1994 |
| JP | 63204621 | 8/1998 |

* cited by examiner

Primary Examiner—Richard Booth
Assistant Examiner—Andre' C. Stevenson
(74) Attorney, Agent, or Firm—Antonelli, Terry, Stout & Kraus, LLP

(57) ABSTRACT

A packaging device for holding thereon a plurality of semiconductor devices to be inspected on an inspection device including a probe to be electrically connected to an electrode of each of the semiconductor devices, comprises, holes for respectively receiving detachably therein the semiconductor devices to keep a positional relationship among the semiconductor devices and a positional relationship between the packaging device and each of the semiconductor devices constant with a spacing between the semiconductor devices, in a direction perpendicular to a thickness direction of the semiconductor devices, and electrically conductive members adapted to be connected respectively to the electrodes of the semiconductor devices, and extending to an exterior of the packaging device so that the probe is connected to each of the electrically conductive members.

15 Claims, 10 Drawing Sheets

PACKAGING DEVICE

6

10
6

METHOD FOR PRODUCING SEMICONDUCTOR DEVICE AND APPARATUS USABLE THEREIN

BACKGROUND OF THE INVENTION AND RELATED ART STATEMENT

The present invention relates to a method for producing semiconductor devices, and to a packaging device usable in such a method.

JP-A-3-131048 discloses a burn-in test method in which semiconductor chips are mounted directly on a substrate to be tested on the substrate.

JP-63-204621 discloses an aging test device in which wafers, each including thereon semiconductor chips thereon, are mounted on a container plate to be tested on the container plate by a probe body.

OBJECT AND SUMMARY OF THE INVENTION

An object of the present invention is to provide a method for producing semiconductor devices, and to provide a packaging device usable in the method, whereby each of the semiconductor devices is easily and securely inspected.

According to the present invention, a method for producing semiconductor devices comprises the steps of:

forming electric circuits on a semiconductor wafer, cutting off the semiconductor wafer to be divided into the semiconductor devices respectively including the electric circuits so that the semiconductor devices are separated away from each other, mounting a plurality of the semiconductor devices onto a packaging device for keeping a positional relationship among the semiconductor devices, and keeping a positional relationship between the packaging device and each of the semiconductor devices constant with a spacing between the semiconductor devices on the packaging device, transferring the packaging device, holding thereon the plurality of the semiconductor devices onto an inspection device so that each of the semiconductor devices on the packaging device is inspected on the inspection device, while the positional relationship among the semiconductor devices and the positional relationship between the packaging device and each of the semiconductor devices are kept constant on the packaging device, and removing the semiconductor devices from the packaging device after each of the semiconductor devices on the packaging device is inspected on the inspection device, so that the semiconductor devices are separated from each other in order to be useable independent of each other.

Since, when the plurality of the discrete semiconductor devices are transferred onto the inspection device and are inspected on the inspection device, the plurality of the discrete semiconductor devices are held in the packaging device so that at least a part of the electrode of each of the semiconductor devices is covered by the packaging device to prevent said part of the electrode from facing to an environment surrounding the packaging device in the thickness direction of the semiconductor devices, the positional relationship among the discrete semiconductor devices and the positional relationship between the packaging device and each of the discrete semiconductor devices are kept constant with the spacing between the discrete semiconductor devices on the packaging device. Each of the discrete semiconductor devices is easily and securely inspected without interference between the semiconductor devices and without any direct damage of either of the discrete semiconductor devices from the environment surrounding the packaging device.

At least one inspection for judging whether or not each of the semiconductor devices is useable after either of a predetermined temperature and/or a predetermined voltage is applied to the each of the semiconductor devices during a predetermined time period and. In addition, an inspection for judging whether or not each of the semiconductor devices performs a predetermined operating characteristic in a redetermined environment condition may be carried out on the inspection device. The method may further comprise the step of selecting the semiconductor devices to be mounted onto the packaging device from the semiconductor devices formed on the semiconductor wafer on the basis of a relationship between an electrical input and an electrical output on each of the semiconductor devices. The selecting step may be carried out after the semiconductor wafer is cut off to be divided into the semiconductor devices or before the semiconductor wafer is cut off to be divided into the semiconductor devices. The number of the semiconductor devices held on the packaging device when the packaging device is transferred onto the inspection device may be smaller than the number of the semiconductor devices formed on the semiconductor wafer.

If all of the semiconductor devices are pressed against the packaging device by an elastic member while each of the semiconductor devices on the packaging device is inspected on the inspection device, the inspection of each of the semiconductor devices is stably carried out while preventing interference between the semiconductor devices. It is preferable for the stable inspection of each of the semiconductor devices that the direction in which all of the semiconductor devices are pressed against the packaging device by the elastic member is opposite to the direction in which an electrically conductive member of the packaging device is pressed against an electrode of the each of the semiconductor devices on the packaging device, in a thickness direction of the semiconductor devices.

The packaging device may be pressed against the inspection device while each of the semiconductor devices on the packaging device is inspected on the inspection device. It is preferable for the stable inspection of each of the semiconductor devices that the direction in which the packaging device is pressed against the inspection device is opposite to the direction in which the electrically conductive member of the packaging device is pressed against the electrode of each of the semiconductor devices on the packaging device.

According to the present invention, a packaging device for holding thereon a plurality of semiconductor devices to be inspected on an inspection device, including a probe to be electrically connected to an electrode of each of the semiconductor devices, comprises, holes for respectively receiving detachably therein the semiconductor devices to keep a positional relationship among the semiconductor devices and a positional relationship between the packaging device and each of the semiconductor devices constant with a spacing between the semiconductor devices, in a direction perpendicular to the thickness direction of the semiconductor devices, or directions perpendicular to each other and perpendicular to the thickness direction of the semiconductor devices, and electrically conductive members adapted to be connected respectively to the electrodes of the semiconductor devices, and extending to an exterior of the packaging device so that the probe is connected to each of the electrically conductive members.

Since the semiconductor devices are received respectively by the holes in order to keep the positional relationship among the semiconductor devices and the positional relationship between the packaging device and each of the semiconductor devices constant with the spacing between the semiconductor devices, in a direction perpendicular to the thickness direction of the semiconductor devices, or directions perpendicular to each other and perpendicular to the thickness direction of the semiconductor devices, and the electrically conductive members are connected respectively to the electrodes of the semiconductor devices when each of the semiconductor devices is inspected, and extend to an exterior of the packaging device so that the probe is connected to each of the electrically conductive members, each of the discrete semiconductor devices is easily and securely inspected without interference between the discrete semiconductor devices and without any direct damage of any of the discrete semiconductor devices from the environment surrounding the packaging device.

The ends of the electrically conductive members exposed to the exterior of the packaging device may be more widely distributed over a surface of the packaging device in comparison with an arrangement of the electrodes on the semiconductor devices.

If a main component (for example, Si) of a part of the packaging device surrounding the holes is equal to that (for example, Si) of the semiconductor devices, a thermal stress between the holes and the semiconductor devices is decreased, irrespective of any temperature change of the packaging device.

If an elastic member presses all of the semiconductor devices against the packaging device in the thickness direction of the semiconductor devices when each of the semiconductor devices on the packaging device is inspected on the inspection device, the inspection of each of the semiconductor devices is stably carried out while preventing interference between the semiconductor devices. It is preferable for the stable inspection of each of the semiconductor devices that direction in which all of the semiconductor devices are pressed against the packaging device by the elastic member is opposite to the direction in which the electrically conductive members are pressed against the semiconductor devices, in the thickness direction of the semiconductor devices, respectively. The probe and each of the electrically conductive members may be elastically connected to each other.

If the packaging device includes a first sheet for supporting the semiconductor devices in the thickness direction of the semiconductor devices, a second sheet having the holes, and the first and second sheets are stacked in the thickness direction of the semiconductor devices, and the electrically conductive members extend through the first sheet in the thickness direction of the semiconductor devices, a complex structure of the packaging device can be easily and correctly formed. If a main component of the second sheet (for example, Si) is equal to that of the semiconductor devices, a thermal stress between the second sheet and the semiconductor devices is decreased, irrespective of any temperature change of the packaging device. The packaging device may further comprise a third sheet which has through holes and covers the second sheet, wherein the first, second and third sheets are stacked in the thickness direction of the semiconductor devices while the through holes are aligned respectively with the holes in the thickness direction of the semiconductor devices. The opening areas of the through holes are larger than those of the holes to prevent the semiconductor devices from being positioned respectively by the through holes, so that the second sheet made with high-accuracy for correctly positioning the semiconductor devices is wholly protected by the third sheet, while the third sheet is prevented from deteriorating the positioning of the semiconductor devices in the holes.

If the packaging device further comprises a support part on which an end of each of the electrically conductive members is arranged, wherein the support part has a pair of projections between which the end of each of the electrically conductive members is arranged in the direction perpendicular to the thickness direction of the semiconductor devices, and the end of each of the electrically conductive members and both of the projections are adapted to contact with each of the semiconductor devices, so that an area of the support part between the end of each of the electrically conductive members and each of the projections is prevented from contacting with each of the semiconductor devices, an area of each of the semiconductor devices adjacent to the electrode is prevented from being pressed by the support part while the electrode and another area of the each of the semiconductor devices far away from the electrode are pressed by the support member, and an attitude of the end of each of the electrically conductive members relative to each of the electrodes is correctly kept by the projections of the support part, both contacting with each of the semiconductor devices. Generally, the area of each of the semiconductor devices or chips adjacent to the electrode includes an easily-breakable electric circuit.

If a clearance is formed between each of the holes and each of the semiconductor devices in both directions perpendicular to each other and perpendicular to the thickness direction of the semiconductor device to prevent each of the semiconductor devices from being compressed in each of the holes in both directions, irrespective of any temperature change in either the packaging device and/or any of the semiconductor devices when the each of the semiconductor devices is inspected on the inspection device, each of the semiconductor devices can be inspected in a stress-free condition in both directions even when a difference in expansion or contraction between the packaging device and the each of the semiconductor devices is caused by the temperature change.

If at least a part of the electrode of each of the semiconductor devices is covered by the packaging device to prevent at least a part of the electrode of each of the semiconductor devices from facing an environment surrounding the packaging device in the thickness direction of the semiconductor devices, the part of the electrode of each of the semiconductor devices is protected from being damaged by the environment.

If the packaging device comprises support parts on each of which an end of each of the electrically conductive members is arranged, and a pair of slits between which each of the support parts with the end is arranged in the direction perpendicular to the thickness direction of the semiconductor devices, a rigidity of the support part is decreased effectively, even when the size of the support part and the distance between the support parts are significantly small.

If an exposed area of an end of the each of electrically conductive members adapted to face the each of the semiconductor devices is smaller than an exposed area of another end of each of the electrically conductive members on the exterior of the packaging device, as seen in the thickness direction of the semiconductor devices, an electrical capacitance between the end of each of the electrically conductive members facing each of the semiconductor devices and the each of the electrodes contacting with the end of each of the electrically conductive members is kept small, while the exposed area of another end of each of the electrically conductive members on the exterior of the packaging device is sufficiently large for being easily and securely connected with the probe of the inspection device.

BRIEF DESCRIPTION OF THE DRAWINGS

FIG. 9b is a schematic oblique-projection view showing a reverse surface of the packaging device of FIG. 9a.

DETAILED DESCRIPTION OF THE PREFERRED EMBODIMENTS

Figure 1:
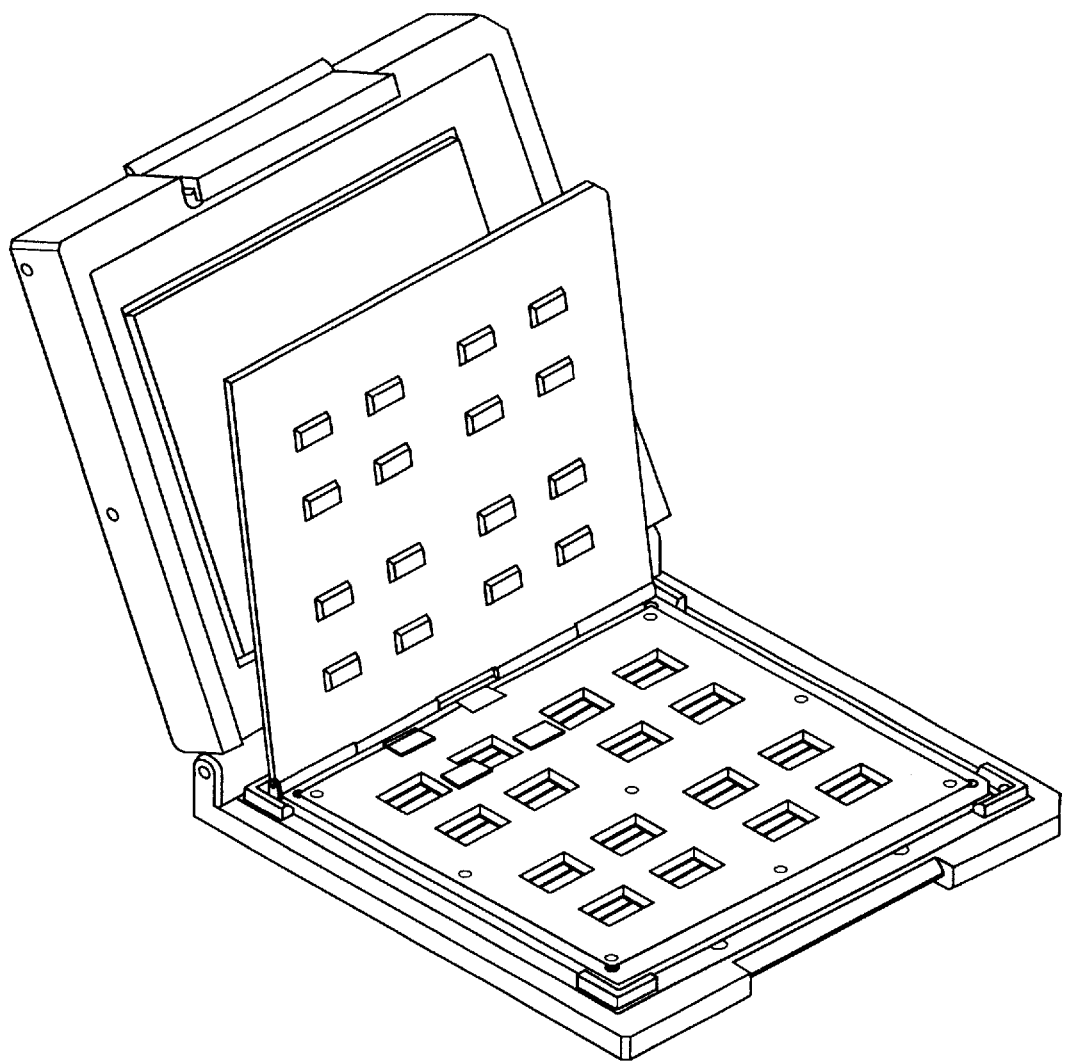
FIG. 1 is a schematic oblique-projection view showing a packaging device of the invention mounted on an inspection device.
Figure 2:
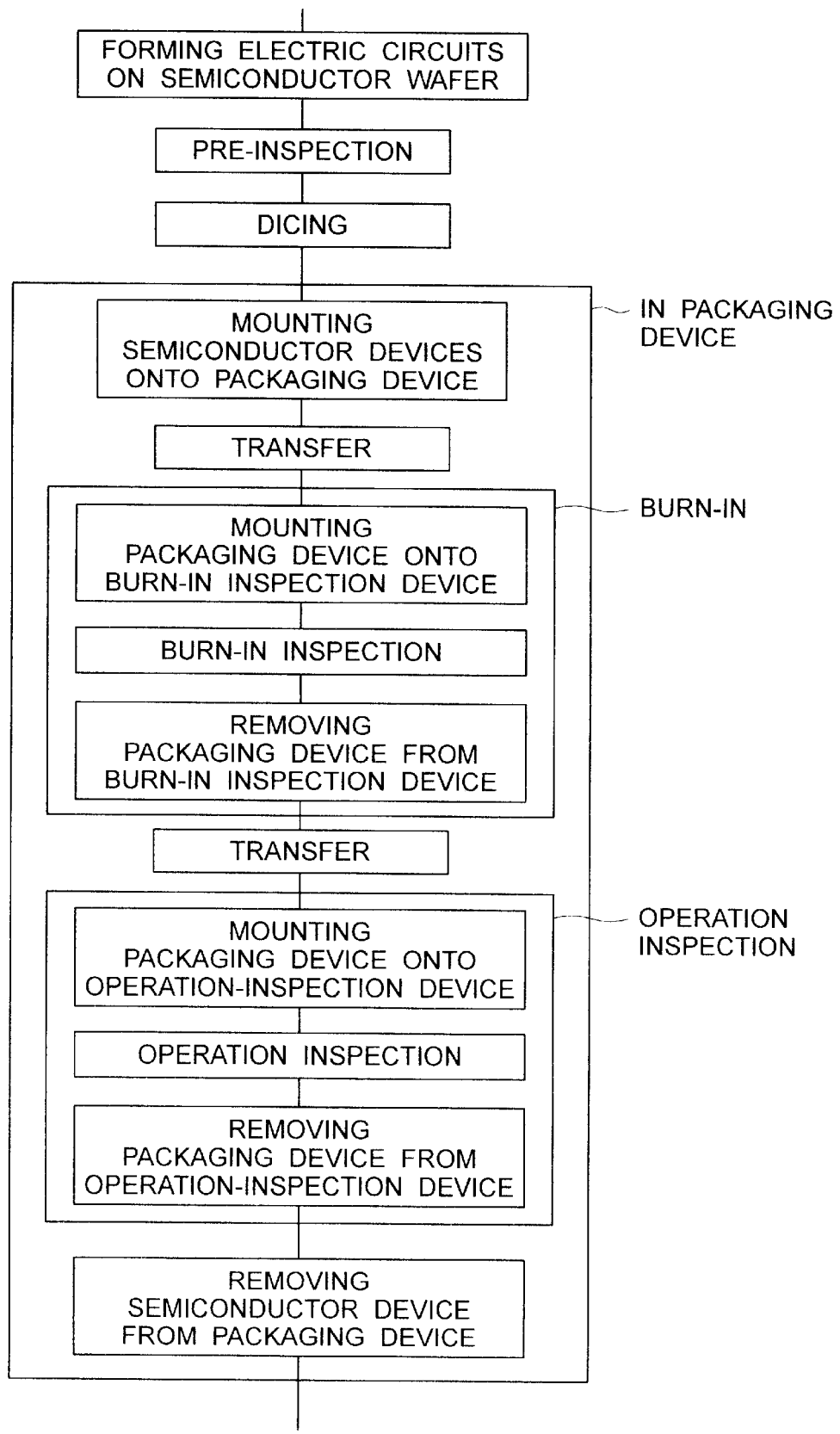
FIG. 2 is a flow chart carried out in a method of the invention.
Figure 3:
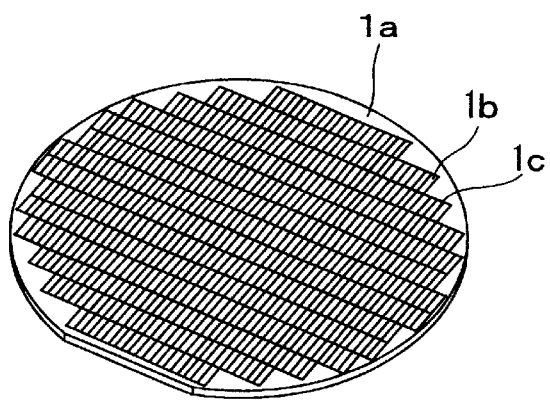
FIG. 3 is a schematic oblique-projection view showing a wafer on which semiconductor devices are formed.

Along with a flow chart shown in FIG. 2, in a method for producing semiconductors, the following processes are carried out:

(1) preparation process (for example, forming electric circuits on a wafer),
(2) pre-inspection by probe,
(3) dicing the wafer to form semiconductor devices,
(4) mounting the semiconductor device into a packaging device,
(5) burn-in treatment,
   (5-1) mounting the packaging device onto a burn-in device,
   (5-2) performing the burn-in treatment,
   (5-3) taking out the packaging device from the burn-in device,
(6) transferring the packaging device from the burn-in device to an operation inspection device,
(7) operation inspection,
   (7-1) mounting the packaging device onto the operation inspection device,
   (7-2) performing operation inspection,
   (7-3) taking out the packaging device from the operation inspection device,
(8) taking out the semiconductor device from the packaging device.

(1) Preparation Process

Figure 4:
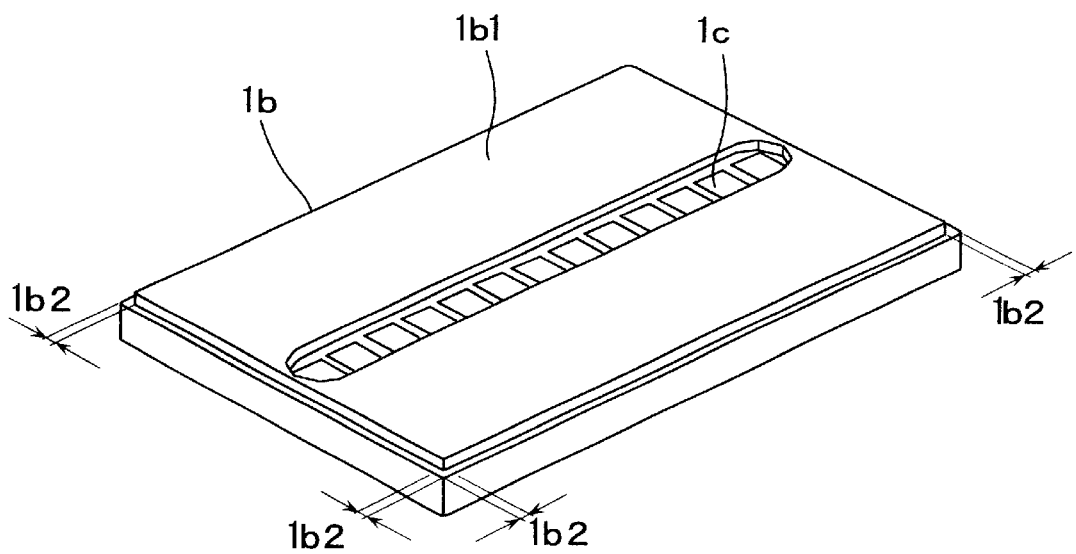
FIG. 4 is a schematic oblique-projection view showing an example of a semiconductor device to be produced by the method of the present invention or to be housed by the packaging device.

The semiconductor devices (for example, LSI circuits) $1b$ are formed on a semiconductor wafer $1a$ in a wafer process apparatus including a diffusion device, a photo-etching device, an epitaxial device and so 25 forth. As shown in FIG. 4, each of the semiconductor devices $1b$ has a group of electrodes $1c$ of Al or Cu, each of which has a length of 10–200 $\mu$m and a thickness of about 1 $\mu$m. The electrodes $1c$ are surrounded by a protect layer $1b1$ of synthetic resin with a thickness of about 1–10 $\mu$m. The protect layer $1b1$ may be prevented from extending to an outer peripheral edge of the semiconductor device $1b$ to form a non-protect-layer bare chip area $1b2$ with a width of about 10–300 $\mu$m between the outer peripheral edge and the protect layer $1b1$, after the semiconductor devices $1a$ are cut out from the wafer. The non-protect-layer bare chip area $1b2$ may be arranged at another area or various areas other than an outer peripheral area of the semiconductor device $1b$.

(2) Pre-Inspection by Probe

Each of the semiconductor devices $1b$ on the wafer is inspected by contacting a probe of a pre-inspection device with each of the electrodes $1c$.

(3) Dicing the Wafer to Form Semiconductor Devices

The wafer is cut off by a dicer or the like to be divided to the semiconductor devices $1b$, as shown in FIG. 4.

(4) Mounting the Semiconductor Device into a Packaging 20 Device

The semiconductor devices $1b$ of a predetermined number not less than two and less than the number of the semiconductor devices $1b$ formed on the wafer are mounted onto a packaging device.

Figure 5:
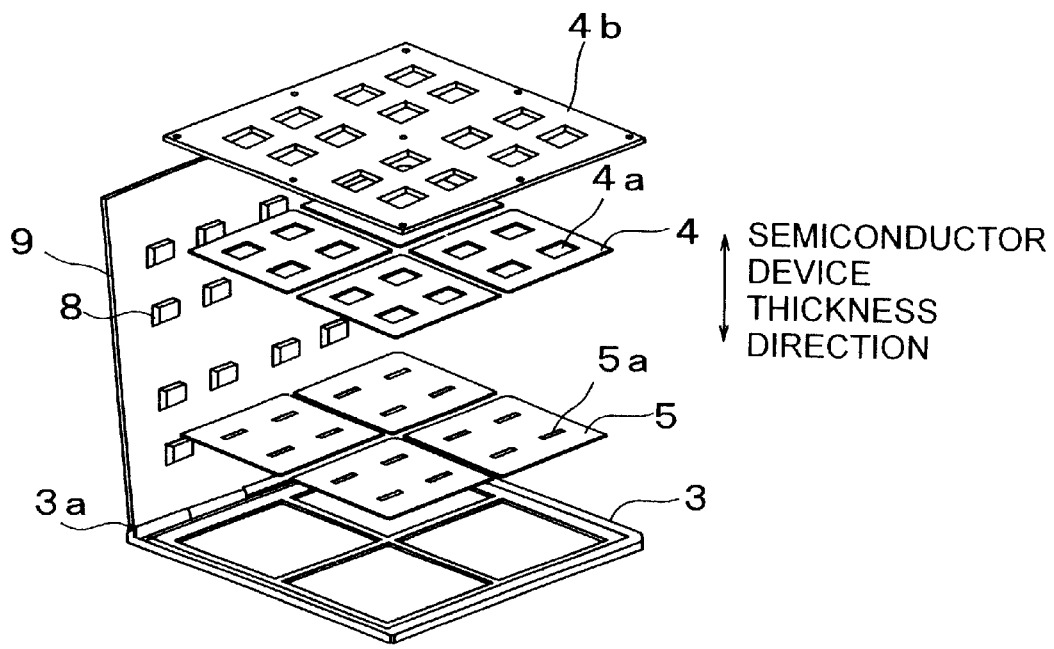
FIG. 5 is a schematic oblique-projection view showing elements of the packaging device.

As shown in FIG. 5, the packaging device includes a base 3, a contact member 5 as the claimed first sheet, a positioning tray 4 as the claimed second sheet, a tray cover $4b$ as the claimed third sheet, elastic members 9 and a closure cover 9.

The base 3 and the closure cover 9 are made of thermo-setting resin, aluminum, stainless steel or ceramic, and are machined after being molded. The base 3 and the closure cover 9 reinforce the contact member 5 and the positioning tray 4 to keep their shape constant against a force applied to the packaging device. The closure cover 9 is swingably supported on the base 3 through hinges $3a$.

The positioning tray 4 has holes $4a$ at a distance from each other. The positioning tray 4 may be divided to a plurality of positioning tray elements, as shown in FIG. 5. A main component of the positioning tray 4 is preferably equal to that (for example, Si) of the semiconductor devices 1b in order to decrease the difference in the coefficient of thermal expansion between the positioning tray 4 and the semiconductor devices 1b. A metallic material or ceramic (for example, aluminum-nitride) whose coefficient of thermal expansion is similar to the coefficient of thermal expansion of the semiconductor devices 1b may be used as a material in the positioning tray 4. The semiconductor devices 1b are accurately positioned in the holes 4a in both directions perpendicular to each other and perpendicular to a thickness direction of the semiconductor devices 1b.

Figure 6:
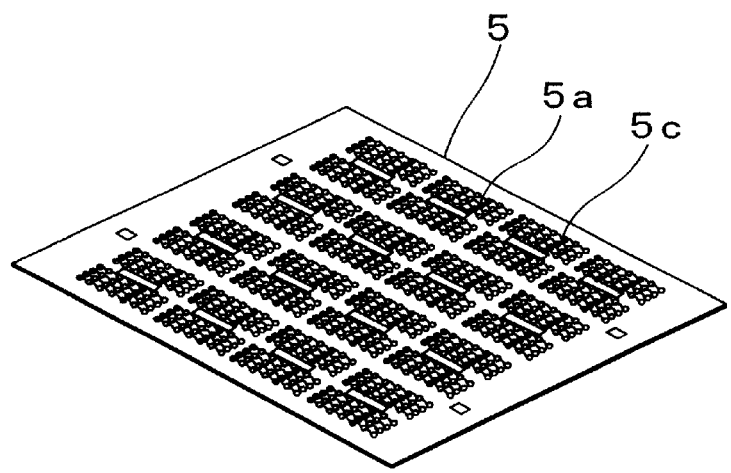
FIG. 6 is a schematic oblique-projection view showing one of the elements for supporting the semiconductor devices in a thickness direction of the semiconductor devices with electrically conductive members therein for connecting each of the electrodes of the semiconductor devices to a probe of the inspection device.
Figure 7A:
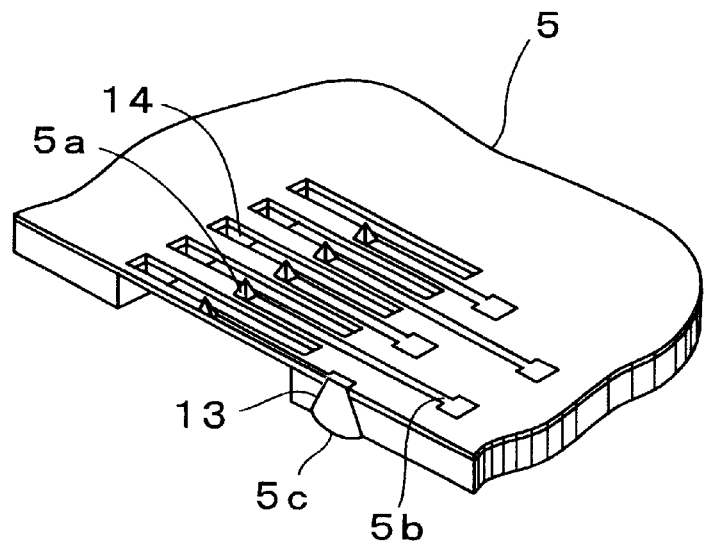
FIG. 7a is a schematic oblique-projection view showing a surface of one of the elements facing the semiconductor devices.
Figure 7B:
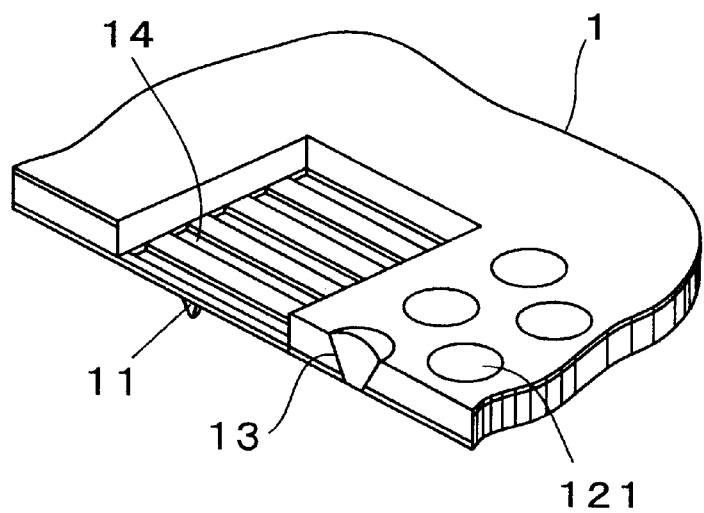
FIG. 7b is a schematic oblique-projection view showing a reverse surface of one of the elements facing the inspection device.
Figure 8:
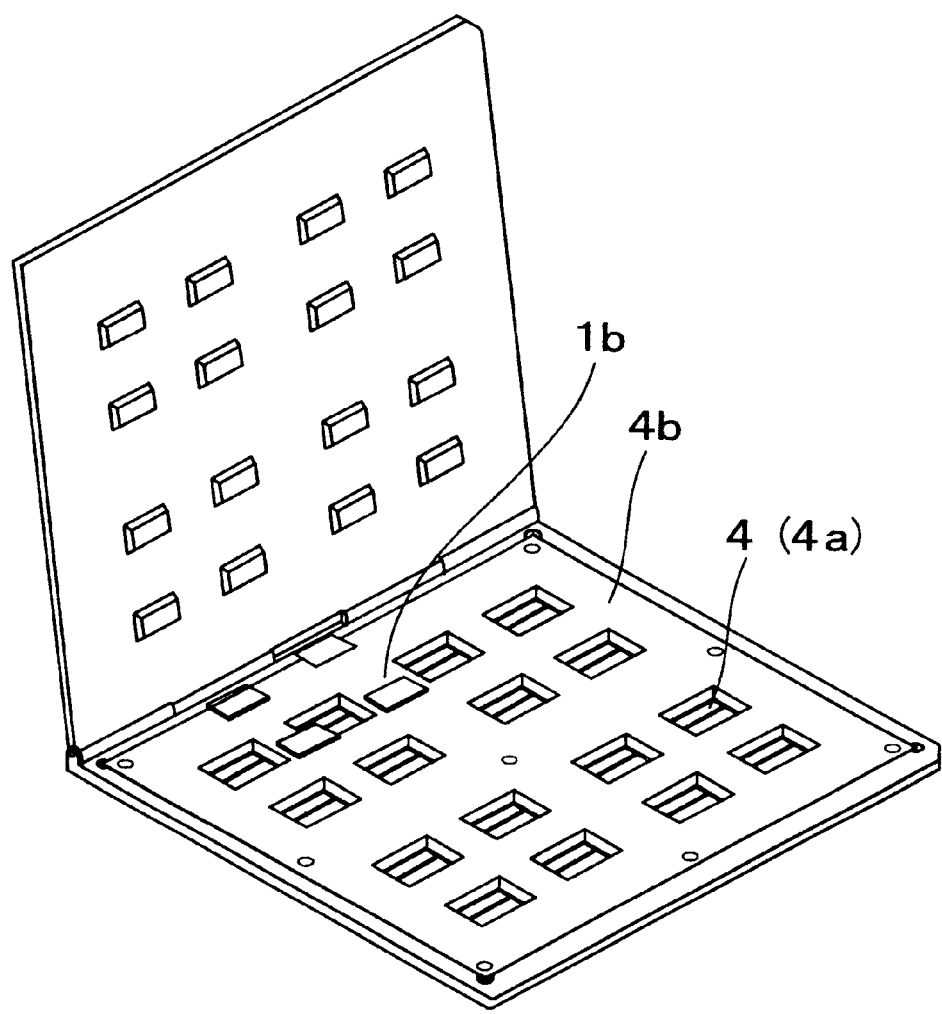
FIG. 8 is a schematic oblique-projection view showing the packaging device of the invention onto which the semiconductor devices are being mounted.
Figure 9A:
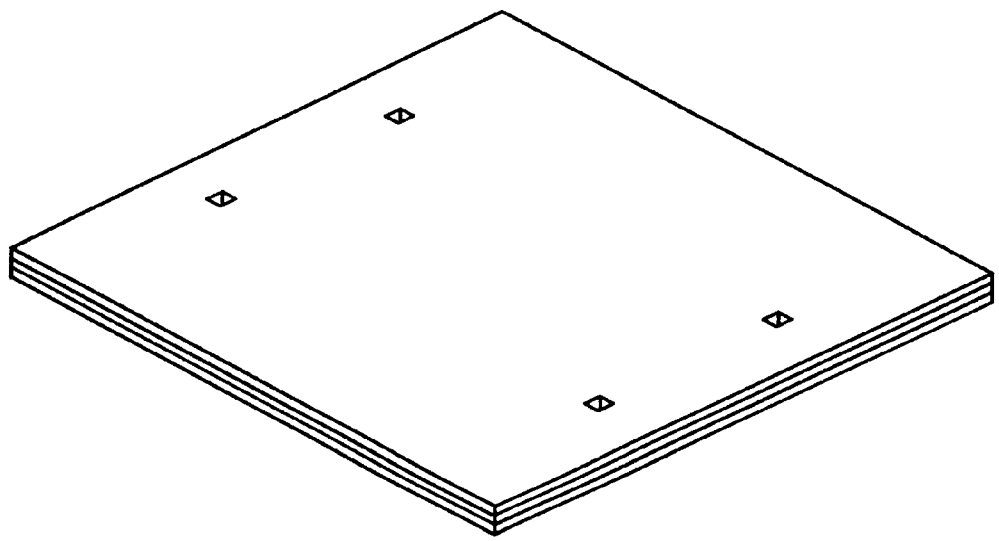
FIG. 9a is a schematic oblique-projection view showing a surface of the packaging device in which the semiconductor devices are set completely.
Figure 9B:
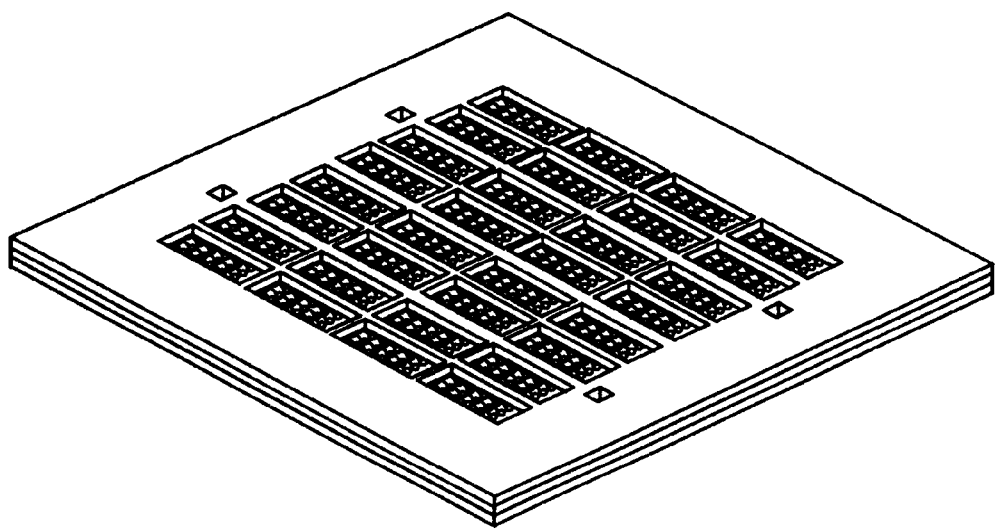

As shown in FIGS. 6 and 7a, a surface of the contact member 5 facing the semiconductor devices 1b includes ends 5a of electrically conductive members 5b, to be contacted respectively with the electrodes 1c. As shown in FIG. 7b, another or reverse the surface of the contact member 5 arranged on an exterior of the packaging device includes ends 5c of the electrically conductive members 5b, to be contacted respectively with a probe of an inspection device. The electrically conductive members 5b extend through or over the contact member 5 from the ends 5a to the ends 5c.

A main component of the contact member 5 is preferably equal to that (for example, Si) of the semiconductor devices 1b in order to decrease the difference in the coefficient of thermal expansion between the contact member 5 and the semiconductor devices 1b. A metallic material or ceramic (for example, aluminum-nitride) whose coefficient of thermal expansion is similar to the coefficient of thermal expansion of the semiconductor devices 1b may be used as a material in the contact member 5. The contact member 5 may be made of glass-epoxy, ceramic, or organic material such as polyimide.

The elastic members 8 press, respectively, the semiconductor devices 1b against the contact member 5, and are made of an elastomer such as silicone-rubber. The elastic members 8 may be springs such as coil-springs.

The tray cover 4b is made of thermo-setting resin, aluminum, stainless steel, or ceramic as similar to the base 3 and the closure cover 9, and are machined after being molded. The tray cover 4b protects the positioning tray 4 and the contact member 5 against the semiconductor devices 1b to be inserted in the holes 4a or contaminant.

The closure cover 9 completely covers the semiconductor devices 1b as seen in the thickness direction of the semiconductor devices 1b.

The ends 5c of the electrically conductive members 5b exposed to the exterior of the packaging device are more widely distributed over another surface or the reverse surface of the packaging device in comparison with an arrangement of the electrodes 1c on the semiconductor devices 1b. An exposed area of each of the ends 5c is significantly larger than an exposed area of each of the electrodes 1c and an exposed area of each of the ends 5a on the surface of the contact member 5 facing to the semiconductor devices 1b, as seen in the thickness direction of the semiconductor devices 1b, so that a capacitance between each of the electrodes 1c and each of the ends 5a is kept small while the exposed area of each of the ends 5c is sufficiently large for being easily and securely connected with a probe of an inspection device. The distance between central positions of the ends 5c is preferably about 0.5–1.5 mm, and the area of the ends 5c as seen in the semiconductor thickness direction is preferably about 0.1–1 mm$^2$.

(5) Burn-in Treatment

The packaging device containing the semiconductor devices 1b is heated to keep the temperature of the semiconductor devices 1b at 100–150° C. for a predetermined time period while an electric stress (voltage) is applied to each of the semiconductor devices 1b through the electrode 1c and the electrically conductive member 5b, so that any occurrence of problems in any of the semiconductor devices 1b is accelerated.

(5-1) Mounting the Packaging Device onto a Burn-in Device

Figure 10A:
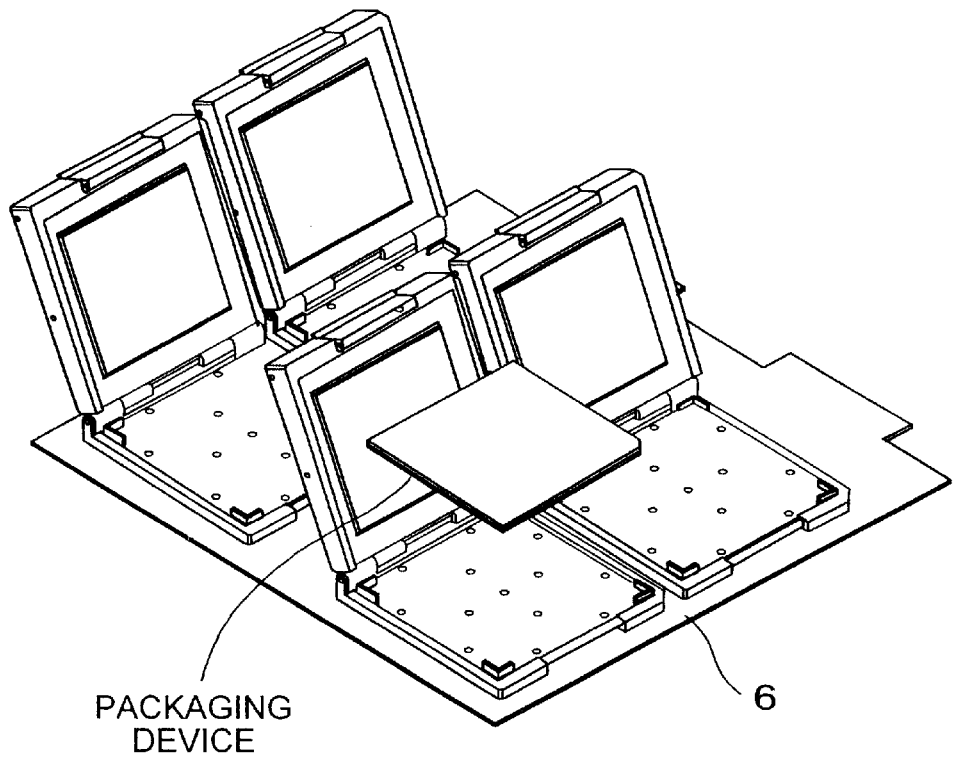
FIG. 10a is a schematic oblique-projection view showing the inspection device before the packaging device is mounted thereon.
Figure 10B:
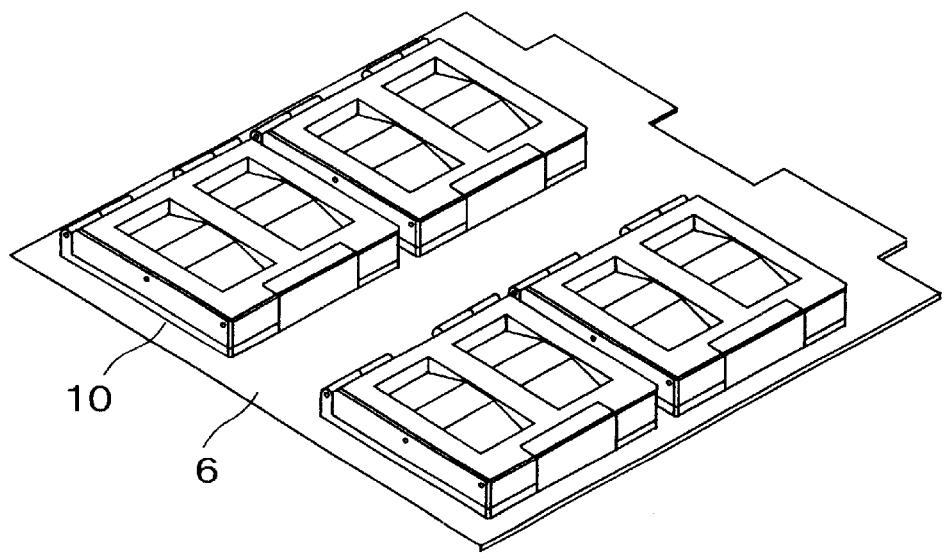
FIG. 10b is a schematic oblique-projection view showing the inspection device after the packaging device is mounted thereon.
Figure 11:
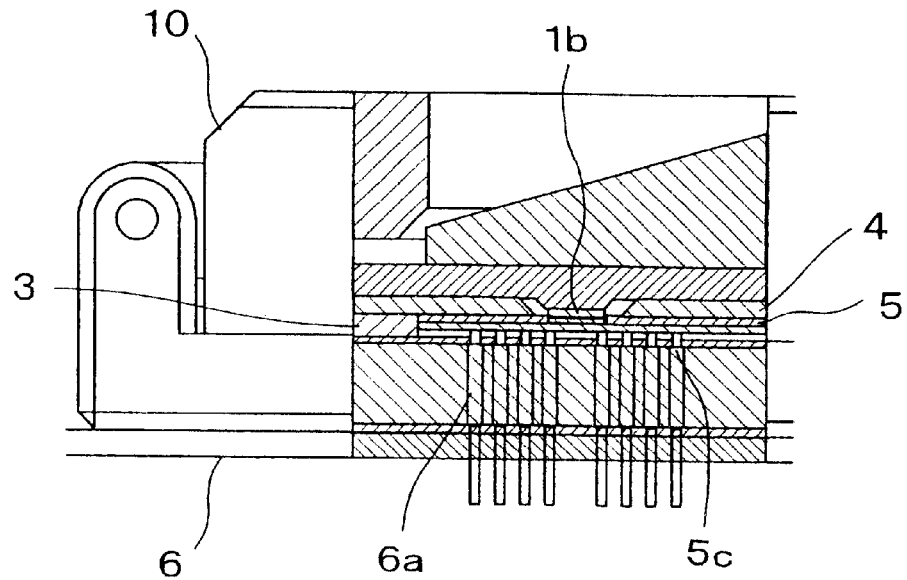
FIG. 11 is a partially cross-sectional view 10 showing a connection from the electrodes of the semiconductor devices to the probe through the electrically conductive members.
Figure 12:
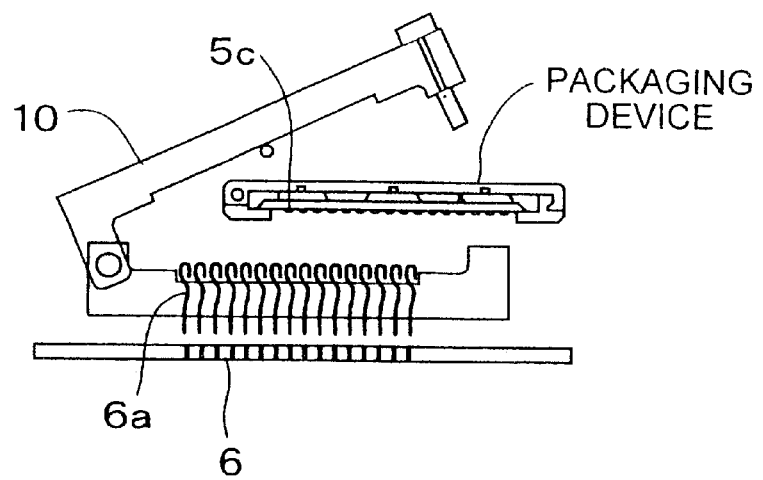
FIG. 12 is a partially cross-sectional side view showing the probes to be connected to the electrically conductive members.

The packaging device is put into a socket 10 on an printed plate 6, through which the electric stress (voltage) is applied to each of the semiconductor devices 1b in the packaging device during the burn-in treatment, as shown in FIG. 10a. The packaging device is compressed into the socket 10 by a cover to keep the electrical communication between the electrically conductive members 5b and the printed plate 6, as shown in FIG. 10b. As shown in FIG. 11, contact probes 6a extending from the printed plate 6 contact respectively with the ends 5c of the electrically conductive members 5b to energize the semiconductor devices 1b during the burn-in treatment. The contact probes 6a of bent metallic plate as shown in FIG. 12, may be replaced by land areas connecting with the ends 5c or coil-spring-supported bars, as shown in FIG. 13.

Figure 13:
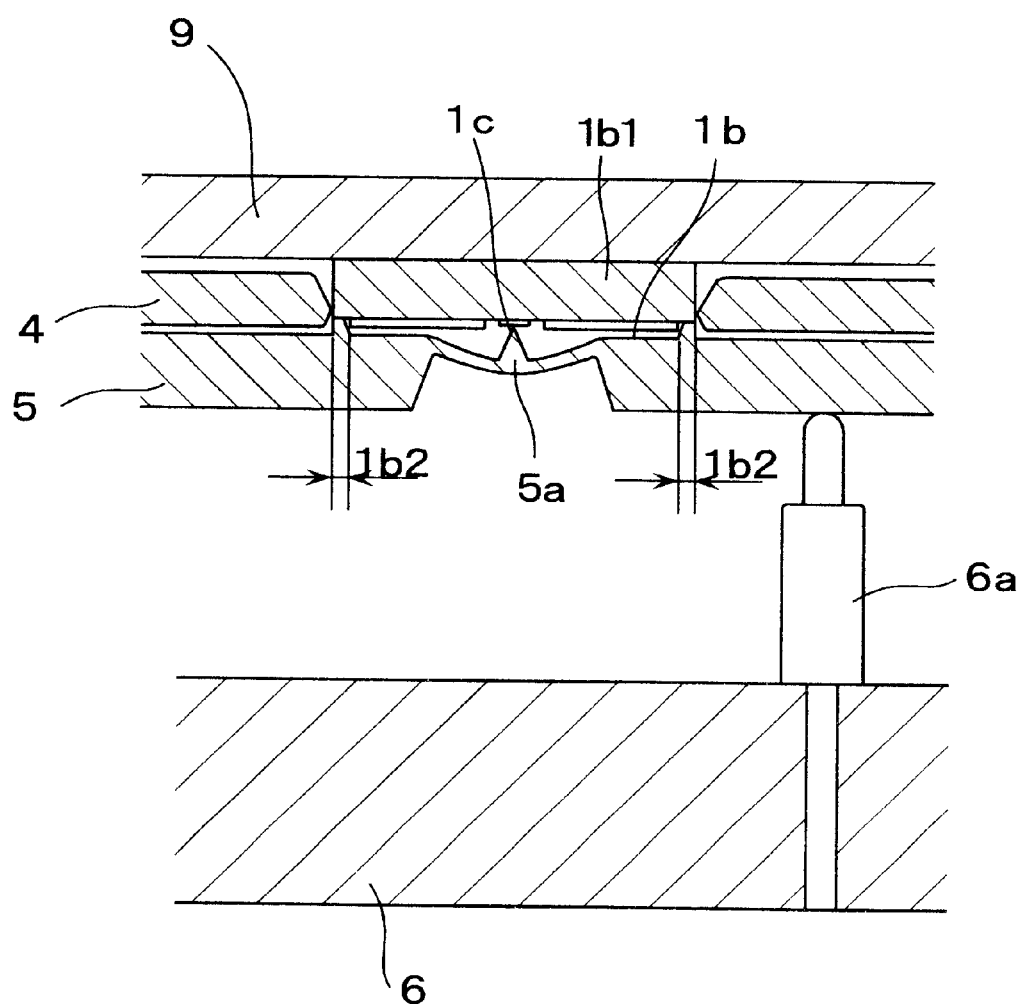
FIG. 13 is a partially cross-sectional side view showing a structure of the packaging device for supporting an area adjacent to each of the electrodes, while the electrodes contact respectively with the electrically conductive members.

As shown in FIG. 13, a support surface of the contact member 5, on which the ends 5a of the electrically conductive members 5b are arranged, has spacer projections 5d between which each of the ends 5a is arranged (a pair of the spacer projections and each of the ends 5a between the spacer projections 5d of the pair are aligned along a substantially straight imaginary line on the support surface). The spacer projections 5d and the ends 5a contact with the semiconductor devices 1b to form securely a space between the contact member 5 and the semiconductor devices 1b at a region of the support surface between the each of the ends 5a and each of the spacer projections 5d of the pair along the substantially straight imaginary line. The spacer projections Sd preferably contact with the non-protect-layer bare chip area 1b2.

By virtue of the space provided between the contact member 5 and the semiconductor devices 1b at the region of the support surface between each of the ends 5a and each of the spacer projections 5d of the pair along the substantially straight imaginary line, the following advantages are achieved:

an easily breakable, important area of the semiconductor device 1b, including thereon an electric circuit under and around the electrodes 1c (corresponding to substantially an area of the protect layer 1b1 is prevented from being compressed by the contact member 5, and an unimportant area of the semiconductor device 1b is compressed by the contact member 5 to hold the semiconductor device 1b, a capacitance between the contact member 5 and the semiconductor device 1b is decreased to improve the responding characteristic of the semiconductor device 1b relative to a high-frequency input signal, the easily breakable, important area of the semiconductor device 1b is prevented from being pressed and being damaged by a contaminant between the contact member and the semiconductor device 1b, and an attitude of the ends 5a to be freely changeable in accordance with a shape of the electrode 1c is prevented from being undesirably and strongly fixed by a region of the support surface close to the electrodes.

(5-2) Performing Burn-in Treatment

A thermal stress and the electric stress are applied to the semiconductor devices 1b for a long time period, so that any occurrence of a problem in any of the semiconductor devices 1b is accelerated.

(5-3) Taking Out the Packaging Device from the Burn-in Device

The packaging device is removed from the socket 10 after the burn-in treatment.

(6) Transferring the Packaging Device from the Burn-in Device to an Operation Inspection Device (7) Operation Inspection (7-1) Mounting the Packaging Device onto the Operation Inspection Device The packaging device is put into a socket on an printed plate for operation inspection (7-2) Performing Operation Inspection An operational characteristic of each of the semiconductor devices 1b is inspected by energizing the semiconductor devices 1b and detecting output signals of the semiconductor devices 1b through the electrodes 1c and the electrically conductive members 5b, while the semiconductor devices 1b are heated to 25–75° C.

(7-3) Taking Out the Packaging Device from the Operation Inspection Device

The packaging device is taken out from the socket.

(8) Taking Out the Semiconductor Device from the Packaging Device

The semiconductor devices 1b are taken out from the packaging device to be used independent of each other.

What is claimed is:

1. A method for producing semiconductor devices, comprising the steps of:

forming electric circuits on a semiconductor wafer, cutting off the semiconductor wafer to be divided to the semiconductor devices respectively including the electric circuits so that the semiconductor devices are separated away from each other, mounting a plurality of the semiconductor devices onto a packaging device for keeping a positional relationship among the semiconductor devices and a positional relationship between the packaging device and each of the semiconductor devices constant with a spacing between the semiconductor devices on the packaging device, transferring the packaging device holding thereon the plurality of the semiconductor devices onto an inspection device so that each of the semiconductor devices on the packaging device is inspected on the inspection device, while the positional relationship among the semiconductor devices and the positional relationship between the paging device and the each of the semiconductor devices are kept constant on the packaging device, and removing the semiconductor devices from the packaging device after the each of the semiconductor devices on the packaging device is inspected on the inspection device, so that the semiconductor devices are separated away from each other to be useable independent of each other.

2. A method according to claim 1, wherein at least one of an inspection for judging whether or not the each of the semiconductor devices is useable after at least one of a predetermined temperature and a predetermined voltage is applied to the each of the semiconductor devices during a predetermined time period and an inspection for judging whether or not the each of the semiconductor devices performs a predetermined operating characteristic in a predetermined environment condition is carried out on the inspection device.

3. A method for producing semiconductor devices, comprising the steps of:

forming electric circuits on a semiconductor wafer, cutting off the semiconductor wafer to be divided to the semiconductor devices respectively including the electric circuits so that the semiconductor devices are separated away from each other, mounting a plurality of the semiconductor devices onto a packaging device for keeping a positional relationship among the semiconductor devices and a positional relationship between the packaging device and each of the semiconductor devices constant with a spacing between the semiconductor devices on the packaging device, transferring the packaging device holding thereon the plurality of the semiconductor devices onto an inspection device so that each of the semiconductor devices on the packaging device is inspected on the inspection device, while the positional relationship among the semiconductor devices and the positional relationship between the packaging device and the each of the semiconductor devices are kept constant on the packaging device, and removing the semiconductor devices from the packaging device after the each of the semiconductor devices on the packaging device is inspected on the inspection device, so that the semiconductor devices are separated away from each other to be useable independent of each other, further comprising the step of selecting the semiconductor devices to be mounted onto the packaging device from the semiconductor devices formed on the semiconductor wafer on the basis of a relationship between an electrical input and an electrical output on each of the semiconductor devices.

4. A method according to claim 3, wherein the selecting step is carried out after the semiconductor wafer is cut off to be divided to the semiconductor devices.

5. A method according to claim 3, wherein the selecting step is carried out before the semiconductor wafer is cut off to be divided to the semiconductor devices.

6. A method according to claim 1, wherein a number of the semiconductor devices held on the packaging device when the packaging device is transferred onto the inspection device is smaller than a number of the semiconductor devices formed on the semiconductor wafer.

7. A method for producing semiconductor devices, comprising the steps of:

forming electric circuits on a semiconductor wafer, cutting off the semiconductor wafer to be divided to the semiconductor devices respectively including the electric circuits so that the semiconductor devices are separated away from each other, mounting a plurality of the semiconductor devices onto a packaging device for keeping a positional relationship among the semiconductor devices and a positional relationship between the packaging device and each of the semiconductor devices constant with a spacing between the semiconductor devices on the packaging device, transferring the packaging device holding thereon the plurality of the semiconductor devices onto an inspection device so that each of the semiconductor devices on the packaging device is inspected on the inspection device, while the positional relationship among the semiconductor devices and the positional relationship between the packaging device and the each of the semiconductor devices are kept constant on the packaging device, and removing the semiconductor devices from the packaging device after the each of the semiconductor devices on the packaging device is inspected on the inspection device, so that the semiconductor devices are separated away from each other to be useable independent of each other, wherein all of the semiconductor devices are pressed against the packaging device by an elastic member while the each of the semiconductor devices on the packaging device is inspected on the inspection device.

8. A method according to claim 7, wherein a direction in which all of the semiconductor devices are pressed against the packaging device by the elastic member is opposite to a direction in which electrically conductive member of the packaging device is pressed against an electrode of the each of the semiconductor devices on the packaging device, in a thickness direction of the semiconductor devices.

9. A method for producing semiconductor devices, comprising the steps of:

forming electric circuits on a semiconductor wafer, cutting off the semiconductor wafer to be divided to the semiconductor devices respectively including the electric circuits so that the semiconductor devices are separated away from each other, mounting a plurality of the semiconductor devices onto a packaging device for keeping a positional relationship among the semiconductor devices and a positional relationship between the packaging device and each of the semiconductor devices constant with a spacing between the semiconductor devices on the packaging device, transferring the packaging device holding thereon the plurality of the semiconductor devices onto an inspection device so that each of the semiconductor devices on the packaging device is inspected on the inspection device, while the positional relationship among the semiconductor devices and the positional relationship between the packaging device and the each of the semiconductor devices are kept constant on the packaging device, and removing the semiconductor devices from the packaging device after the each of the semiconductor devices on the packaging device is inspected on the inspection device, so that the semiconductor devices are separated away from each other to be useable independent of each other, wherein the packaging device is pressed again the inspection device while the each of the semiconductor devices on the packaging device is inspected on the inspection device.

10. A method according to claim 9, wherein a direction in which the packaging device is pressed against the inspection device is opposite to a direction in which an electrically conductive member of the packaging device is pressed against an electrode of the each of the semiconductor devices on the packaging device.

11. A method for producing semiconductor devices, comprising the steps of:

forming electric circuits on a semiconductor wafer, cutting off the semiconductor wafer to be divided to the semiconductor devices respectively including the electric circuits so that the semiconductor devices are separated away from each other, mounting a plurality of the semiconductor devices onto a packaging device for keeping a positional relationship among the semiconductor devices and a positional relationship between the packaging device and the semiconductor devices, transferring the packaging device holding thereon the plurality of the semiconductor devices onto an inspection device so that each of the semiconductor devices on the packaging device is inspected on the inspection device by electrically connecting the semiconductor devices to the inspection device, while the semiconductor devices are held by the packaging device, and removing the semiconductor devices from the packaging device after the semiconductor devices on the packaging device are inspected on the inspection device.

12. A method according to claim 11, wherein at least one of an inspection for judging whether or not the each of the semiconductor devices is useable after at least one of a predetermined temperature and a predetermined voltage is applied to the each of the semiconductor devices during a predetermined time period and an inspection for judging whether or not the each of the semiconductor devices performs a predetermined operating characteristic in a predetermined environment condition is carried out on the inspection device.

13. A method according to claim 11, further comprising the step of selecting the semiconductor devices to be mounted onto the packaging device from the semiconductor devices formed on the semiconductor wafer on the basis of a relationship between an electrical input and an electrical output on each of the semiconductor devices.

14. A method according to claim 13, wherein the selecting step is carried out after the semiconductor wafer is cut off to be divided to the semiconductor devices.

15. A method according to claim 13, wherein the selecting step is carried out before the semiconductor wafer is cut off to be divided to the semiconductor devices.

* * * * *